(12) United States Patent
Takahashi et al.

(10) Patent No.: US 10,658,151 B2
(45) Date of Patent: May 19, 2020

(54) STAGE DEVICE AND CHARGED PARTICLE BEAM DEVICE

(71) Applicant: Hitachi High-Technologies Corporation, Tokyo (JP)

(72) Inventors: Motohiro Takahashi, Tokyo (JP); Masaki Mizuochi, Tokyo (JP); Shuichi Nakagawa, Tokyo (JP); Tomotaka Shibazaki, Tokyo (JP); Naruo Watanabe, Tokyo (JP); Akira Nishioka, Tokyo (JP); Takanori Kato, Tokyo (JP); Hironori Ogawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/240,885

(22) Filed: Jan. 7, 2019

(65) Prior Publication Data
US 2019/0259567 A1  Aug. 22, 2019

(30) Foreign Application Priority Data

Feb. 20, 2018 (JP) ................................. 2018-027793

(51) Int. Cl.
*H01J 37/20* (2006.01)
*H01J 37/285* (2006.01)
*H01J 37/29* (2006.01)

(52) U.S. Cl.
CPC ............ *H01J 37/20* (2013.01); *H01J 37/285* (2013.01); *H01J 37/29* (2013.01)

(58) Field of Classification Search
USPC ..................................................... 250/442.11
See application file for complete search history.

(56) References Cited

U.S. PATENT DOCUMENTS

| 4,856,904 | A | * | 8/1989 | Akagawa | ............... | H01L 21/681 |
| | | | | | | 356/400 |
| 4,948,330 | A | * | 8/1990 | Nomura | ............... | G03F 7/70758 |
| | | | | | | 414/754 |
| 5,850,280 | A | * | 12/1998 | Ohtomo | ............... | G03F 7/70358 |
| | | | | | | 355/53 |
| 7,234,675 | B2 | * | 6/2007 | Ueno | ....................... | B23Q 1/58 |
| | | | | | | 248/657 |
| 7,907,289 | B2 | * | 3/2011 | Mizuta | ................... | G01B 11/06 |
| | | | | | | 356/237.2 |
| 2006/0066715 | A1 | * | 3/2006 | Fukui | .................... | G03F 7/2053 |
| | | | | | | 347/262 |
| 2018/0188514 | A1 | * | 7/2018 | Arianpour | ............ | G02B 21/006 |

FOREIGN PATENT DOCUMENTS

JP   2010-110870 A   5/2010

* cited by examiner

*Primary Examiner* — Phillip A Johnston
(74) *Attorney, Agent, or Firm* — Mattingly & Malur, PC (57) ABSTRACT

To provide a lightweight and highly rigid stage device that can move in X and Y directions and a Z direction, and a charged particle beam device including the stage device. A stage device includes a chuck that is loaded with a sample, an XY stage that moves in X and Y directions, and a Z stage that moves in a Z direction. The Z stage includes: an inclined part that is fixed to the XY stage and includes an inclined surface inclined with respect to an XY plane; a movement part that moves on the inclined surface; and a table that is fixed to the movement part and is provided with the a plane parallel to the XY plane.

9 Claims, 14 Drawing Sheets

STAGE DEVICE AND CHARGED PARTICLE BEAM DEVICE

CLAIM OF PRIORITY

The present application claims priority from Japanese Patent Application JP 2018-027793 filed on Feb. 20, 2018, the content of which are hereby incorporated by references into this application.

BACKGROUND OF THE INVENTION

1. Field of the Invention

The present invention relates to a stage device provided in a charged particle beam device, and particularly to weight reduction and high rigidity of the stage device.

2. Description of the Related Art

A charged particle beam device is a device that irradiates a sample with a charged particle beam such as an electron beam and detects charged particles emitted from the sample to form an image for observing the sample. In order to observe a desired position of the sample, the charged particle beam device includes a stage device that moves the sample in a two-dimensional direction, that is, X and Y directions. In addition, in a case where an operation distance is changed according to an acceleration voltage of the charged particle beam, the stage device moves the sample in a direction perpendicular to the X and Y directions, that is, a Z direction.

For example, JP-A-2010-110870 (Patent Literature 1) discloses a stage device that moves a sample in the Z direction. Patent Literature 1 discloses a stage device that converts horizontal thrust force by an actuator into a vertical movement by a combination of a wedge mechanism and a vertical guide, so as to move the sample in the Z direction.

However, in Patent Literature 1, since the stage device at least includes a wedge mechanism, two guides for moving the wedge mechanism in a horizontal direction, and a vertical guide, movable mass of the stage device increases and the rigidity of each guide decreases. An increase in the mass and a decrease in the rigidity lengthen the time until the sample is substantially stationary after the sample is moved to a desired position, and reduce the throughput of observation by the charged particle beam device.

SUMMARY OF THE INVENTION

Accordingly, an object of the invention is to provide a lightweight and highly rigid stage device that can move in X and Y directions and a Z direction, and a charged particle beam device including the stage device.

In order to achieve the above object, the invention is a stage device including a chuck that is loaded with a sample, an XY stage that moves in X and Y directions, and a Z stage that moves in a Z direction, in which the Z stage includes: an inclined part that is fixed to the XY stage and includes an inclined surface inclined with respect to an XY plane; a movement part that moves on the inclined surface; and a table that is fixed to the movement part and is provided with a plane parallel to the XY plane.

In addition, the invention is a charged particle beam device including the stage device.

According to the present invention, a lightweight and highly rigid stage device that can move in the X and Y directions and the Z direction, and a charged particle beam device including the stage device can be provided.

DESCRIPTION OF THE PREFERRED EMBODIMENTS

Embodiment 1

Hereinafter, embodiments of a stage device and a charged particle beam device according to the invention will be described with reference to the drawings. In the description and the drawings below, constituent elements having the same function and configuration are denoted by the same reference numerals, and redundant description thereof is omitted.

Figure 1:
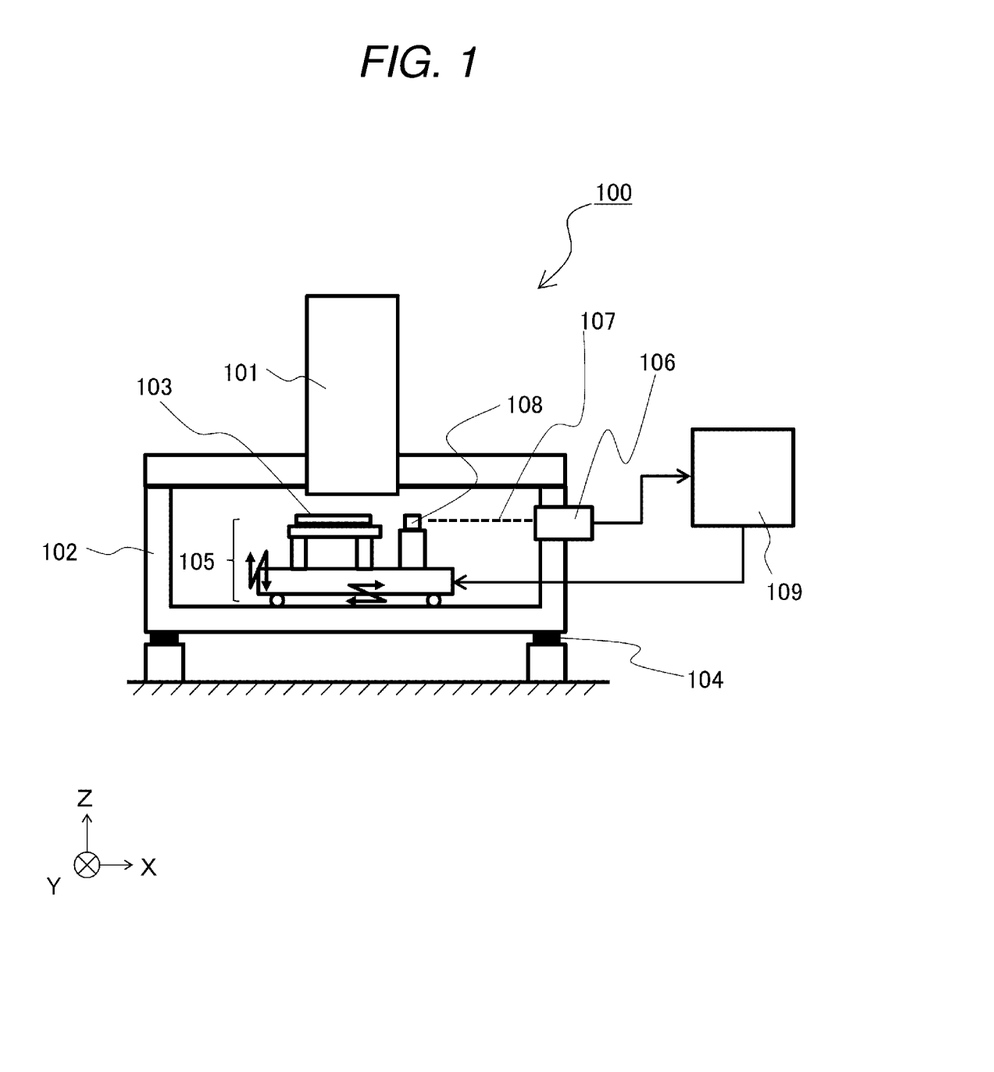
FIG. 1 is a view showing the entire configuration of a charged particle beam device 100 of the invention.

FIG. 1 is a view of the entire configuration of a charged particle beam device 100. The charged particle beam device 100 includes an electro-optical system lens-barrel 101 and a sample chamber 102. The electro-optical system lens-barrel 101 irradiates a sample 103 disposed in the sample chamber 102, for example, a wafer, with an electron beam, detects secondary electrons or reflected electrons emitted from the sample 103, and outputs detection signals. An image obtained by converting the output signals is used for measuring a line width of a pattern on the sample 103 and evaluating shape accuracy. An irradiation direction of the electron beam is defined as a Z direction in FIG. 1.

The sample chamber 102 is supported by a vibration isolation mount 104. A stage device 105 loaded with the sample 103 is disposed in the sample chamber 102, and can move in an X direction and a Y direction which are orthogonal to the Z direction, as well as in the Z direction. A position of the stage device 105 is measured by irradiating a mirror 108, which is provided on the stage device 105, with a laser light 107 from a laser interferometer 106 provided at the sample chamber 102. Based on the measurement result, the position of the stage device 105 is controlled by a controller 109.

Figure 2:
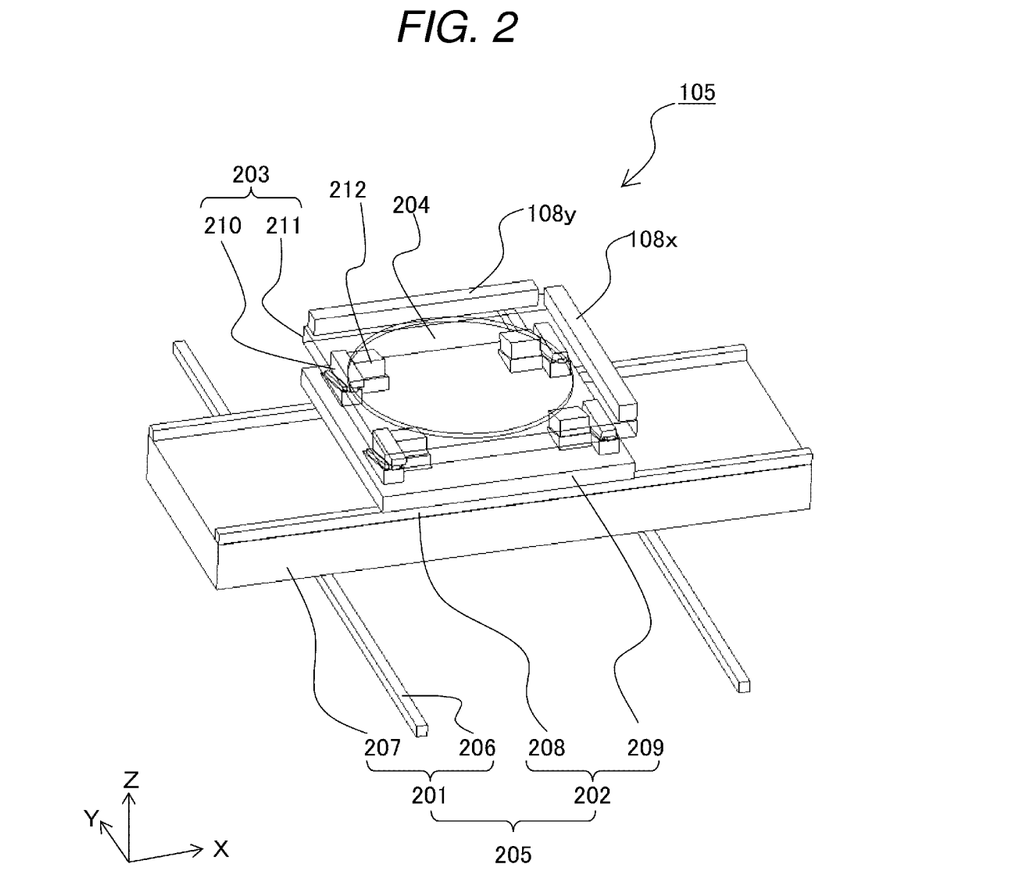
FIG. 2 is a perspective view of a stage device 105 of Embodiment 1.

The stage device 105 of the present embodiment is described with reference to FIG. 2. FIG. 2 is a perspective view, which is partially transparent to help understand the structure. The stage device 105 includes a Y stage 201 movable in a Y direction, an X stage 202 movable in an X direction, a Z stage 203 movable in a Z direction, and a chuck 204 loaded with the sample 103 which are superposed in the Z direction. The Y stage 201 and the X stage 202 are collectively referred to as an XY stage 205. Hereinafter, each part will be described.

The Y stage 201 includes a Y-direction guide 206 and a Y table 207. The Y-direction guide 206 is fixed to the sample chamber 102, and guides the Y table 207 in the Y direction. The Y table 207 is disposed on the Y-direction guide 206, and is moved in the Y direction by an actuator (not illustrated) or the like.

The X stage 202 includes an X-direction guide 208 and an X table 209. The X-direction guide 208 is fixed to the Y table 207, and guides the X table 209 in the X direction. The X table 209 is disposed on the X-direction guide 208, and is moved in the X direction by an actuator (not illustrated) or the like.

The Z stage 203 includes a slope mechanism 210 and a top table 211. The slope mechanism 210 is fixed to the X table 209, and guides the top table 211 in Z and Y directions. The top table 211 is disposed on the slope mechanism 210, and is moved in the Z and Y directions by thrust force of drive parts 212 of the slope mechanism 210. An upper surface of the top table 211 is parallel to an XY plane. On the upper surface of the top table 211, a chuck 204 is provided together with an X mirror 108x and a Y mirror 108y that are related to control of a position of the XY stage 205.

A plurality of slope mechanisms 210 are disposed, so that the rigidity in a rotational direction around a Z axis of the top table 211 can be increased. In addition, although the Z stage 203 was disposed on the XY stage 205 in FIG. 2, the Z stage 203 may be disposed below the XY stage 205.

Figure 3:
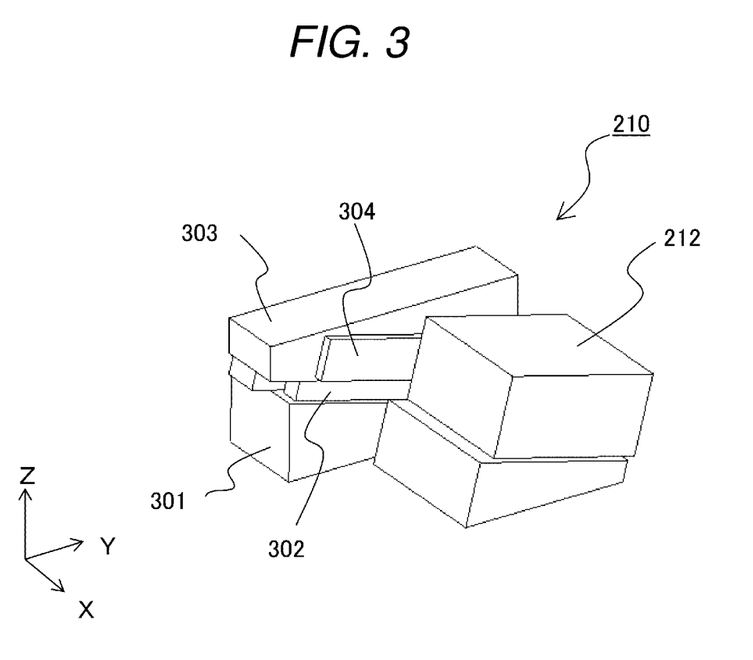
FIG. 3 is a perspective view of a slope mechanism 210 of Embodiment 1.

The slope mechanism 210 of the present embodiment will be described with reference to FIG. 3. FIG. 3 is a perspective view from a direction different from that in FIG. 2. The slope mechanism 210 includes an inclined part 301, a guide 302, a movement part 303, a plate 304, and a drive part 212. Hereinafter, each part will be described.

The inclined part 301 is fixed to the XY stage 205, and includes an inclined surface inclined with respect to an XY plane. An inclined direction of the inclined surface is preferably parallel to a ZX plane or a ZY plane. An inclined direction of the inclined part 301 in FIG. 3 is parallel to the ZY plane.

The guide 302 is provided on the inclined surface of the inclined part 301, and guides the movement part 303 in the inclined direction. Since stroke of the guide 302 may be short, it is possible to use an infinite circulation linear guide that is generally used or a cross roller guide with finite stroke. In a case where a cross roller guide is used, weight reduction can be achieved.

The movement part 303 moves on the inclined surface of the inclined part 301. In addition, the top table 211 is fixed to the movement part 303.

The plate 304 is fixed to the movement part 303, and receives thrust force of the drive part 212. Since the plate 304 receives the thrust force, the movement part 303 moves on the inclined surface.

The drive part 212 is fixed to the XY stage 205, and generates thrust force for moving the movement part 303. An electromagnetic motor or an ultrasonic motor can be used in the drive part 212. In order to inhibit thermal deformation of the top table 211, it is preferable to provide the drive part 212 that is a heat source on the XY stage 205, and to reduce heat transfer to the top table 211. If the ultrasonic motor, which has a calorific value smaller than that of a common electromagnetic motor, is used in the drive part 212, the heat transfer to the top table 211 can be further reduced.

According to the configuration described above, since the top table 211 on the upper surface of which the chuck 204 loaded with the sample 103 is provided can be moved in the Z and Y directions, the sample 103 can be moved in the Z direction. Since the sample 103 also moves in the Y direction along with movement in the Z direction, the controller 109 moves the Y stage 201 so as to counteract movement distance in the Y direction. The movement distance in the Y direction is calculated based on the movement distance in the Z direction and an inclination angle of the inclined part 301.

Figure 4A:
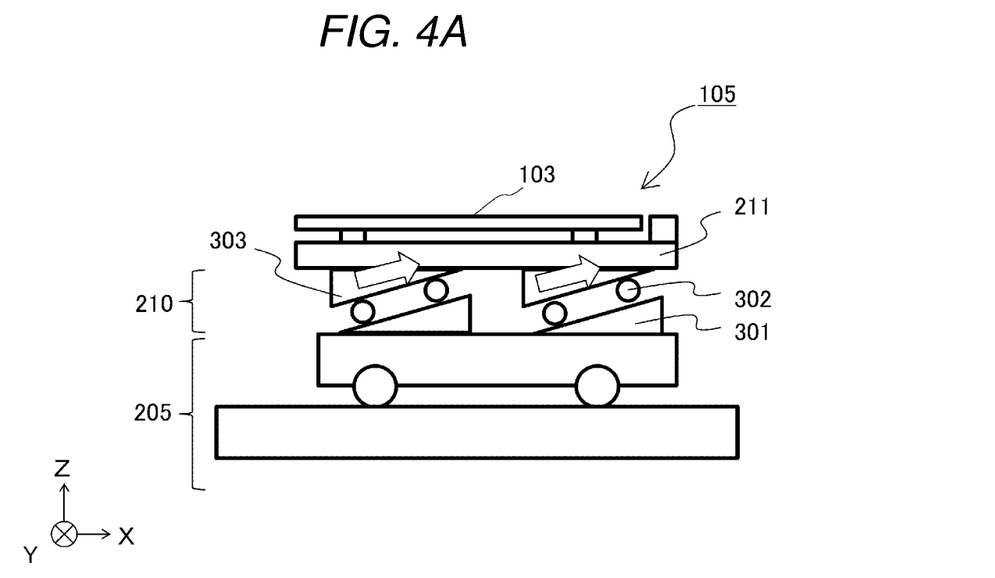
FIG. 4A is a schematic view of the slope mechanism 210 of Embodiment 1.
Figure 4B:
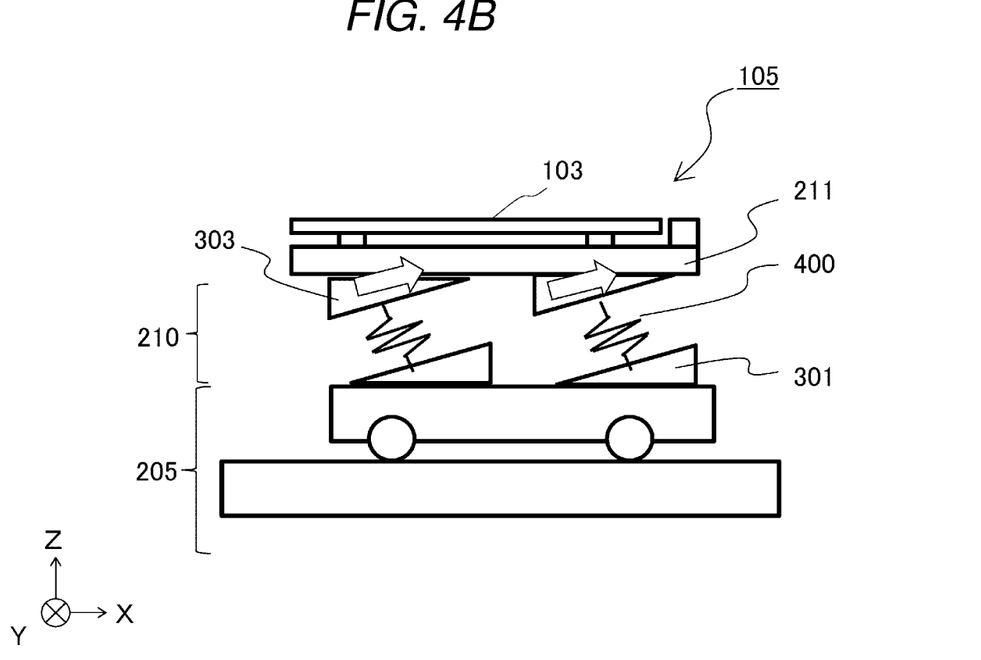
FIG. 4B is a view illustrating a spring model of the slope mechanism 210 of Embodiment 1.

FIGS. 4A and 4B illustrate a schematic view of the slope mechanism 210 and a spring model thereof. FIG. 4A is a schematic view, and FIG. 4B illustrates a spring model. As illustrated in FIG. 4A, in the slope mechanism 210 disposed between the XY stage 205 and the top table 211, the guide 302 that can be regarded as an elastic body only exists between the inclined part 301 and the movement part 303 that can be regarded as rigid bodies. As illustrated in FIG. 4B, the guide 302 is replaced by a spring 400. For example, in a case where four slope mechanisms 210 are provided, if the rigidity of the spring 400 is defined as k, the rigidity between the XY stage 205 and the top table 211 is 4k by parallel combination of the four springs 400.

Figure 5A:
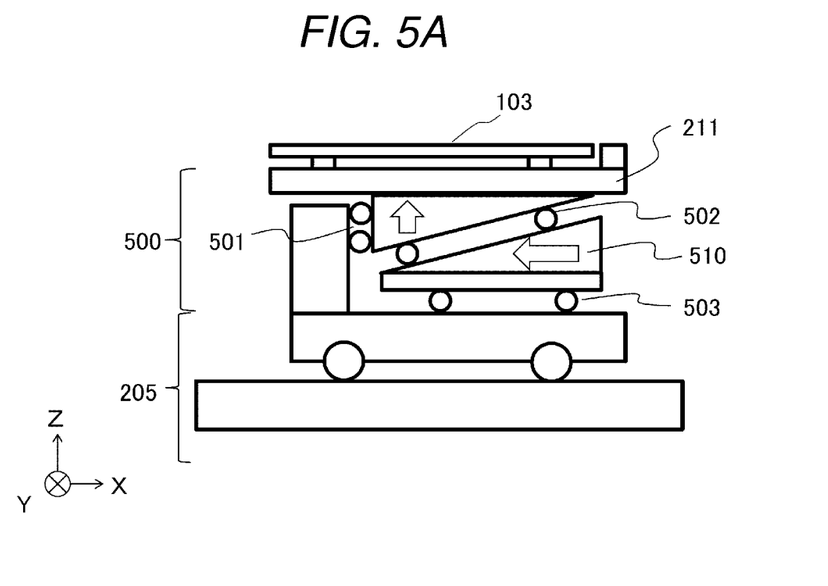
FIG. 5A is a schematic view of a Z stage 500 having a structure of the prior art as a comparative example.
Figure 5B:
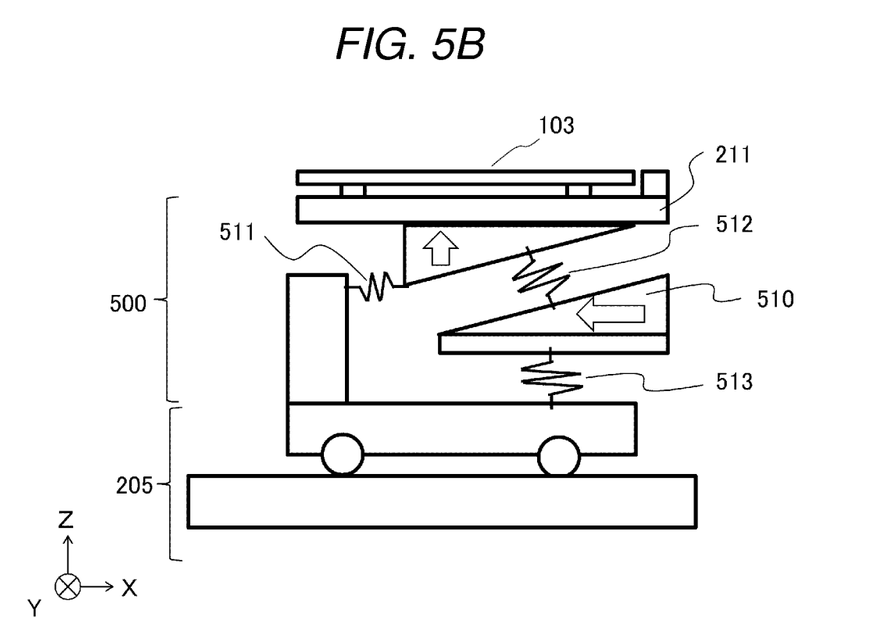
FIG. 5B is a view illustrating a spring model of the Z stage 500 having a structure of the prior art as a comparative example.

FIGS. 5A and 5B illustrate a schematic view of a Z stage 500 having a structure of the prior art as a comparative example and a spring mode thereof. FIG. 5A is a schematic view, and FIG. 5B illustrates a spring model. In the Z stage 500 having a structure of the prior art, the top table 211 is moved in the Z direction by a combination of a vertical guide 501 and a mechanism in which a wedge 510 is inserted between the top table 211 and the XY stage 205. That is, guides 501, 502 and 503, which can be regarded as elastic bodies, exist between the top table 211 and the XY stage 205. As illustrated in FIG. 5B, the guides 501, 502 and 503 are replaced by springs 511, 512 and 513 respectively. Since the guide 501 is shorter than the guides 502 and 503, the rigidity of the spring 511 is lower than that of the springs 512 and 513, and the rigidity between the XY stage 205 and the top table 211 is mainly determined by the springs 512 and 513. If the lengths of the guides 502 and 503 are twice of the guide 302 respectively and the rigidity of the springs 512 and 513 is defined as 2k respectively, the rigidity between the XY stage 205 and the top table 211 is k by a serial combination of the spring 512 and the spring 513. Therefore, the rigidity of the stage device in the present embodiment is estimated to be four times that of the structure of the prior art.

As described above, the Z stage 203 provided with the slope mechanism 210 in the present embodiment can have rigidity sufficiently higher than that of the structure of the prior art. In addition, since the number of components of the Z stage 203 is smaller than that of the structure of the prior art, the weight reduction can be achieved. That is, according to the present embodiment, since a lightweight and highly rigid Z stage 203 that can move in the Z direction can be achieved, and is mounted on the charged particle beam device 100 in combination with the XY stage 205, the throughput of observation can be improved.

Figure 6:
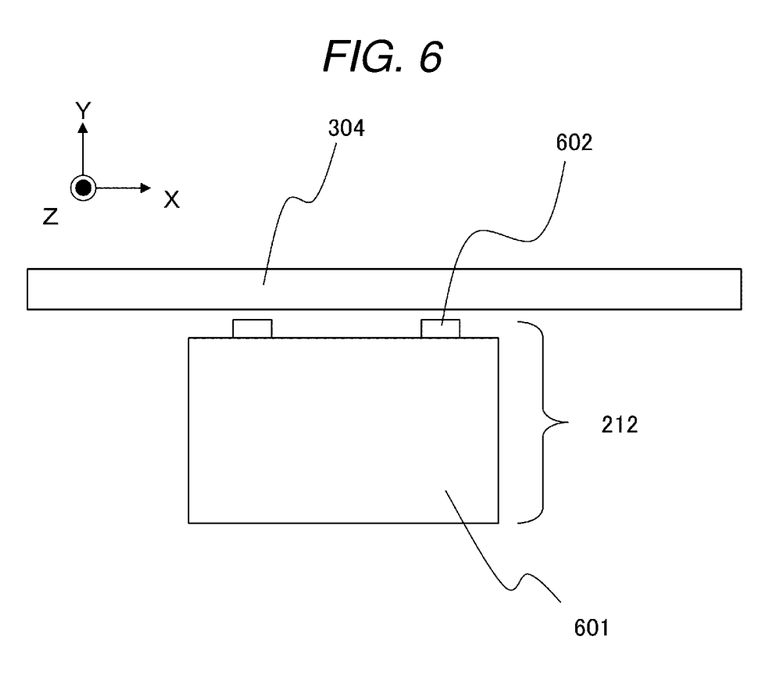
FIG. 6 is a view illustrating operation of an ultrasonic motor as an example of a drive part 212.

Here, operation of the ultrasonic motor that is an example of the drive part 212 will be described with reference to FIG. 6. The ultrasonic motor includes a motor body 601 and a contact part 602. The motor body 601 vibrates the contact part 602, and applies thrust force to the plate 304 pressed against the contact part 602. A frequency of the contact part 602 is constant in an ultrasonic region, and a drive speed can be controlled by changing vibration amplitude.

Figure 7:
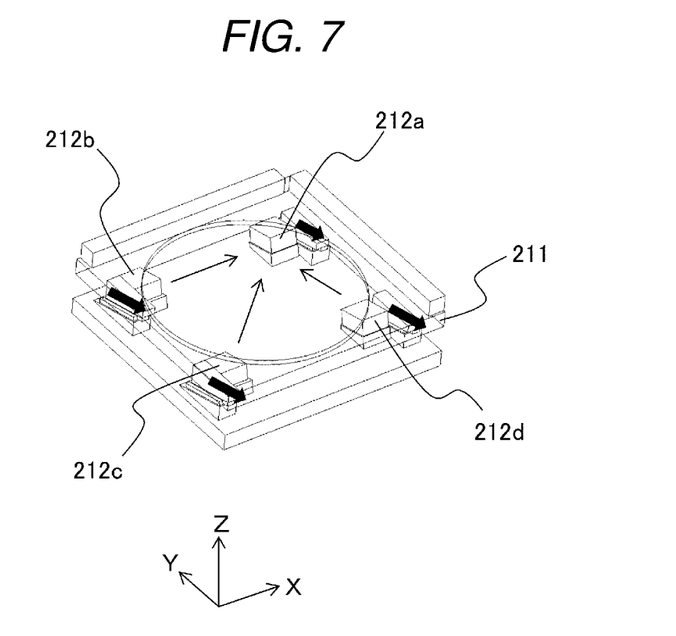
FIG. 7 is a view illustrating an example of a case where there is an individual difference in thrust force of the drive part 212.

In addition, with respect to loads above a certain level, slippage occurs between the plate 304 and the contact part 602. The slippage between the plate 304 and the contact part 602 averages thrust force of each of the drive parts 212 even in a case where there is individual differences in the thrust force of the drive parts 212, and inhibits deformation of the top table 211 and rotation around the Z axis. FIG. 7 illustrates an example of a case where the thrust force of a drive part 212a is smaller than thrust force of the other drive parts 212b, 212c and 212d. When the thrust force of the drive parts 212b, 212c and 212d is transmitted to the drive part 212a whose thrust force is smaller than the other drive parts, via the top table 211, slippage occurs between the plate 304 of the drive part 212a and the contact part 602, so that thrust force of the drive parts 212a to 212d is averaged. As a result, even if there are individual differences in thrust force, deformation of the top table 211 can be avoided and a position error due to the deformation of the top table 211 can be reduced.

Embodiment 2

The Z stage 203 including four slope mechanisms 210 is described in Embodiment 1. Since the number of the slope mechanism 210 is not limited to four, a case where there is one or three slope mechanisms 210 will be described in the present embodiment.

Figure 8A:
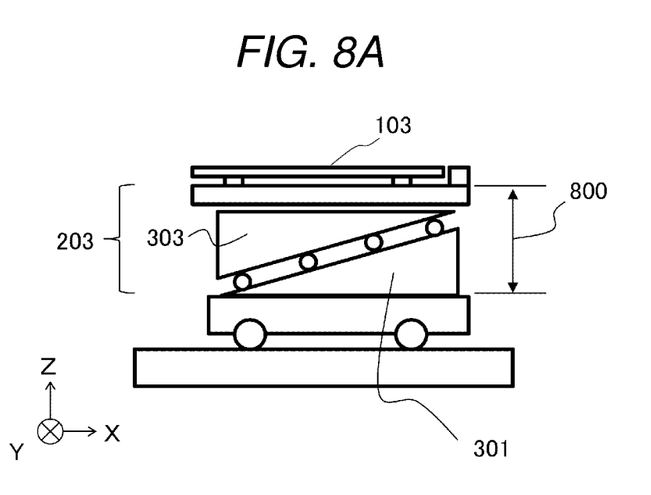
FIG. 8A is a schematic view showing a case where there is one slope mechanism.
Figure 8B:
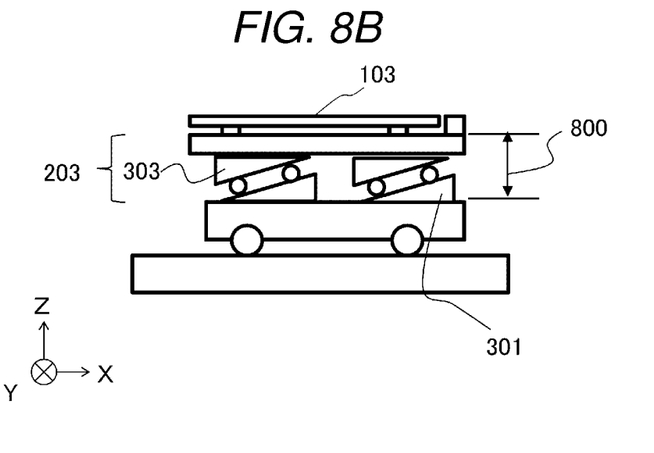
FIG. 8B is a schematic view showing a case where there are four slope mechanisms.

A case where there is one slope mechanism 210 will be described in comparison with a case where there are four slope mechanisms 210 with reference to FIGS. 8A and 8B. FIG. 8A is a schematic view showing a case where there is one slope mechanism 210, and FIG. 8B is a schematic view showing a case where there are four slope mechanisms 210. In the case where there is one slope mechanism 210, as illustrated in FIG. 8A, the inclined surface of the inclined part 301 can be enlarged and the movable distance of the movement part 303 is lengthened, so that the operation distance can be lengthened, which easily corresponds to the acceleration voltage of the charged particle beam.

In the case where there are four slope mechanisms 210, as illustrated in FIG. 8B, the height 800 of the Z stage 203 can be reduced. In addition, the total volume of the inclined part 301 and the movement part 303 can be reduced, and weight reduction can be achieved.

Figure 9:
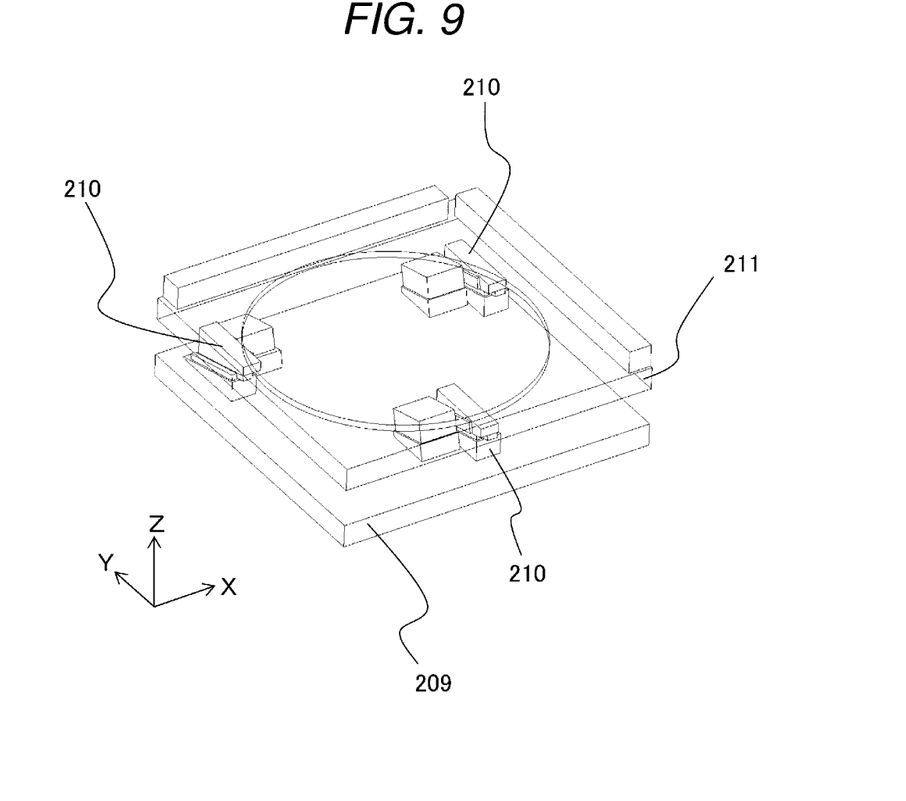
FIG. 9 is a perspective view showing a case where there are three slope mechanisms.

A case where there are three slope mechanisms 210 will be described with reference to FIG. 9. In this case, compared with the case where there are four slope mechanisms 210, the deformation of the top table 211 can be inhibited even if there are errors in the inclination angle of each inclined part 301.

Embodiment 3

The structure of the Z stage 203 is mainly described in Embodiment 1. In the present embodiment, the relationship between the movement direction of the Z stage 203 and those of the Y stage 201 and the X stage 202 will be described.

Figure 10A:
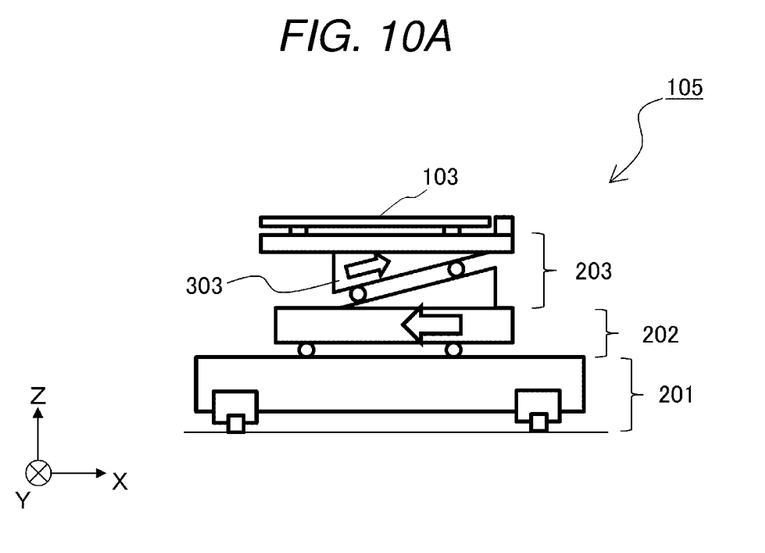
FIG. 10A is a view illustrating a case where a movement direction of a Z stage 203 is parallel to a ZX plane.
Figure 10B:
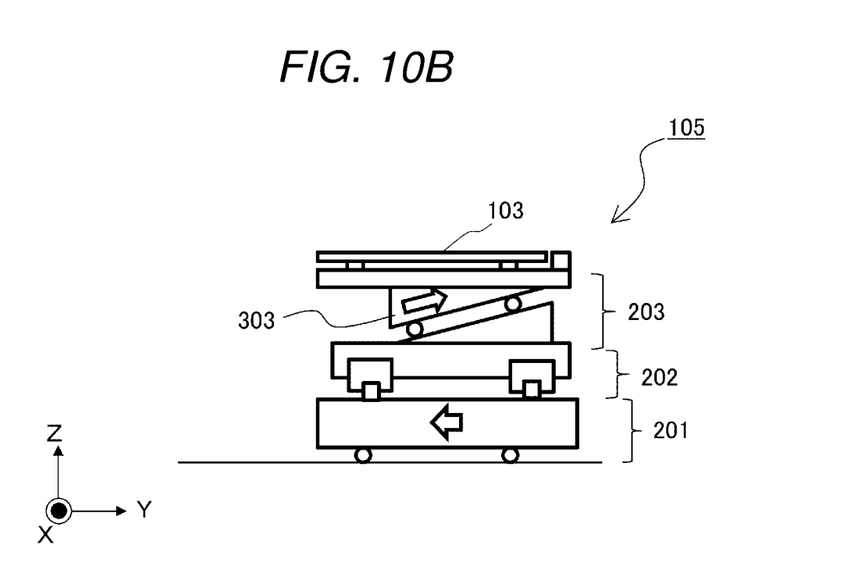
FIG. 10B is a view illustrating a case where a movement direction of the Z stage 203 is parallel to a ZY plane.

FIGS. 10A and 10B shows the stage device 105 in which the Z stage 203, the x stage 202, and the Y stage 201 are superposed in an order from the sample 103 side. FIG. 10A illustrates a case where the movement direction of the Z stage 203 is parallel to the ZX plane, and FIG. 10B illustrates a case where the movement direction of the Z stage 203 is parallel to the ZY plane.

In FIG. 10A, an X-direction component of vibration of the movement part 303 during movement may affect the vibration characteristic in the X direction of the X stage 202, and the drive characteristic of the X stage 202 may be deteriorated. In contrast, in FIG. 10B, since a Y-direction component of the vibration of the movement part 303 affects the vibration characteristics in the Y direction of the X stage 202 and the Y stage 201, and the mass of the affected object is larger than that in the case of FIG. 10A, deterioration of the drive characteristics of the two stages is inhibited.

Further, in FIG. 10A, the Y stage is increased in size to ensure the movement distance of the X stage 202 sufficient to counteract the distance by which the sample 103 moved in the X direction along with the movement of the movement part 303. In contrast, in FIG. 10B, the Y stage 201 disposed at the lowest section may be moved to counteract the distance by which the sample 103 moved in the Y direction along with the movement of the movement part 303, so that it is not necessary to increase the sizes of the X stage 202 and the Y stage 201. Therefore, it is possible to reduce the size of the stage device 105 in FIG. 10B.

That is, it is desired that the movement direction of the Z stage 203 and the movement direction of the X stage 202 or the Y stage 201 disposed at the lowest section are in the same plane. In other words, the movement direction of the movement part 303 is desired to be parallel to the ZY plane in a case where the X stage 202 is disposed on the sample 103 side, and to be parallel to the ZY plane in a case where the Y stage 201 is disposed on the sample 103 side.

The stage device 105 and the charged particle beam device 100 of the invention are not limited to the above embodiments, and constituent elements may be modified and embodied without departing from the scope of the invention. In addition, a plurality of constituent elements disclosed in the above embodiments may be appropriately combined. Further, some constituent elements may be deleted from all the constituent elements illustrated in the above embodiments.

What is claimed is:

1. A stage device, comprising:
    a chuck that is loaded with a sample;
    an XY stage that moves in X and Y directions; and
    a Z stage that moves in a Z direction,
    wherein the Z stage includes one or more slope mechanisms which each include:
        an inclined part that is fixed to the XY stage and includes an inclined surface inclined with respect to an XY plane;
        a movement part that opposes to the inclined surface of the inclined part;
        a drive motor that is fixed to the XY stage and configured to move the movement part along the inclined surface; and
        a guide that is provided only between the movement part and the inclined surface of the inclined part and to guide the movement part along the inclined surface, and wherein the Z stage further includes a table that is fixed to the movement part and is provided with an upper surface which is parallel to the XY plane.

2. The stage device according to claim 1,
wherein the XY stage includes an X stage that moves in an X direction and a Y stage that moves in a Y direction which are superposed in the Z direction, and
the movement direction of the movement part is parallel to a ZX plane or a ZY plane.

3. The stage device according to claim 2,
wherein the movement direction of the movement part is parallel to the ZY plane and the X stage is disposed on the sample side.

4. The stage device according to claim 1,
wherein the drive motor is an ultrasonic motor.

5. The stage device according to claim 1,
wherein the movement part moves along an inclined direction of the inclined surface.

6. The stage device according to claim 1,
wherein the slope mechanisms are fixed on the XY stage.

7. A charged particle beam device, comprising the stage device according to claim 1.

8. The stage device according to claim 2,
wherein the movement direction of the movement part is parallel to the ZX plane and the Y stage is disposed on the sample side.

9. The stage device according to claim 1,
wherein the chuck is provided on the upper surface of the table.

* * * * *